United States Patent [19]

Morse et al.

[11] Patent Number: 5,051,804
[45] Date of Patent: Sep. 24, 1991

[54] PHOTODETECTOR HAVING HIGH SPEED AND SENSITIVITY

[75] Inventors: Jeffrey D. Morse, Martinez; Raymond P. Mariella, Jr., Danville, both of Calif.

[73] Assignee: The United States of America as represented by the United States Department of Energy, Washington, D.C.

[21] Appl. No.: 444,339

[22] Filed: Dec. 1, 1989

[51] Int. Cl.$^5$ .................. H01L 27/14; H01L 29/161; H01L 29/205
[52] U.S. Cl. ........................................ 357/30; 357/16; 357/61; 357/88; 357/90
[58] Field of Search ............... 357/30 B, 30 E, 16, 357/30 Q, 61, 88, 90

[56] References Cited

U.S. PATENT DOCUMENTS

| | | | |
|---|---|---|---|
| 4,254,429 | 3/1981 | Yamazaki | 357/16 |
| 4,378,259 | 3/1983 | Hasegawa et al. | 357/16 |
| 4,383,269 | 5/1983 | Capasso | 357/30 |
| 4,473,835 | 9/1984 | Forrest et al. | 357/30 |
| 4,475,477 | 10/1984 | Capasso et al. | 357/30 |
| 4,553,155 | 11/1985 | Chen et al. | 357/4 |
| 4,590,507 | 5/1986 | Capasso et al. | 357/30 |
| 4,694,318 | 9/1987 | Capasso et al. | 357/30 |
| 4,816,082 | 3/1989 | Guha et al. | 357/305 |
| 4,933,728 | 6/1990 | Fukuzawa et al. | 357/16 |

*Primary Examiner*—Jerome Jackson, Jr.
*Assistant Examiner*—Ngan V. Ngo
*Attorney, Agent, or Firm*—James D. McFarland; L. E. Carnahan; William R. Moser

[57] ABSTRACT

The present invention provides a photodetector having an advantageous combination of sensitivity and speed; it has a high sensitivity while retaining high speed. In a preferred embodiment, visible light is detected, but in some embodiments, x-rays can be detected, and in other embodiments infrared can be detected. The present invention comprises a photodetector having an active layer, and a recombination layer. The active layer has a surface exposed to light to be detected, and comprises a semiconductor, having a bandgap graded so that carriers formed due to interaction of the active layer with the incident radiation tend to be swept away from the exposed surface. The graded semiconductor material in the active layer preferably comprises $Al_{1-x}Ga_xAs$. An additional sub-layer of graded $In_{1-y}Ga_yAs$ may be included between the $Al_{1-x}Ga_xAs$ layer and the recombination layer. The recombination layer comprises a semiconductor material having a short recombination time such as a defective GaAs layer grown in a low temperature process. The recombination layer is positioned adjacent to the active layer so that carriers from the active layer tend to be swept into the recombination layer. In an embodiment, the photodetector may comprise one or more additional layers stacked below the active and recombination layers. These additional layers may include another active layer and another recombination layer to absorb radiation not absorbed while passing through the first layers. A photodetector having a stacked configuration may have enhanced sensitivity and responsiveness at selected wavelengths such as infrared.

20 Claims, 7 Drawing Sheets

PHOTODETECTOR HAVING HIGH SPEED AND SENSITIVITY

The United States Government has rights in this invention pursuant to Contract No. W7405-ENG-48 between the United States Department of Energy and the University of California for the operation of Lawrence Livermore National Laboratory.

BACKGROUND OF THE INVENTION

1. Field of the Invention

The present invention relates to photodetectors for detecting the intensity of incident electromagnetic radiation. Particularly, the present invention relates to photodetectors having an active layer comprising a graded bandgap semiconductor material. When used as a photodetector, the present invention provides a photodetector having both a short response time and a high sensitivity.

2. Description of Related Art

Many applications exist for devices which change their resistance when exposed to light. Such devices may be termed "photodetectors". As an example of an application, photodetectors may be used in the home to control automatic night lights which turn on at dusk and turn off at dawn. They can also be used to measure illumination levels, as in exposure meters for cameras. Many systems include a light beam aimed at the photodetector, which signal the presence of an object between the source and detector. Such systems are useful in moving-object counters, burglar alarms, and many other applications. Photodectors are used in optical signaling systems in which information is transmitted by a light beam and is received at a photoconductive cell. Photodetectors could be used for electrical pulse generators, sampling gates, high-voltage switches, and other applications in addition to traditional use for light detection.

Photodetectors typically comprise a photoconductive semiconductor material, for example silicon (Si), gallium arsenide (GaAs), indium phosphate (InP), or cadmium selenium (CdSe). Considerations in choosing a semiconductor material for a particular application include its energy gap, which in turn determines the range of wavelengths that can be detected, the time response, and the optical sensitivity of the material. A photodetector may comprise one or more types of semiconductive material. Performance of a photodetector may be judged by criteria including sensitivity and response time. "Sensitivity" refers to the current produced by a photodetector with respect to the incident electromagnetic power; for example, a high sensitivity photodetector provides more amperes per watt of incident power (amps/watt). Equivalently, a photodetector with high sensitivity will produce more current for a given intensity of incident radiation than one with a low sensitivity. Sensitivity is affected by the mobility of the electrons in the material; a material like GaAs with a higher mobility has a higher sensitivity because the electrons can move at a greater speed.

"Response time" refers to minimum time variation that can be detected by the photodetector; a photodetector with a short response time (a faster photoconductor) can detect an intensity variation that occurs in a few fractions of a second. For example, a picosecond variation may be detected by a photodetector with a fast response time, while that same picosecond variation may go unnoticed by a photodetector with a slower response time.

One type of conventional photodetector comprises a semiconductor block with a pair of electrodes separating a gap on which electromagnetic radiation (light) may be made incident. This gap between the electrodes is typically open to incident electromagnetic radiation. A voltage source connected to the electrodes applies a voltage across the gap on the semiconductor block, and current is observed as an indication of the magnitude of incident radiation. When no radiation is present, the resistance of the block is high for most photoconductors, and only a small ("dark") current can be measured. However, when electromagnetic radiation is made incident upon the region between the electrodes, electron-hole pairs form and drift apart under the influence of a voltage across that region; electrons are drawn toward the positive pole, holes are drawn toward the negative pole. Formation of electron-hole pairs occurs due to interaction between electromagnetic radiation and a semiconductor; if the photon has an energy greater or equal to the bandgap energy of the semiconductor material, then an electron-hole pair is created in the semiconductor as each photon is absorbed in the material. If a voltage is being continuously applied across the semiconductor, the electron and hole will tend to separate, thus creating a current flowing through the photodetector. Thus, the magnitude of the incident radiation is related to the magnitude of the current produced in the photodetector. However, after removal of the incident radiation, the carriers (electrons and holes) remain for a finite period of time until they can be recombined. The term "carriers" is often used to refer to either the electrons, or holes, or both. The rate at which electrons and holes recombine is called the recombination rate, and is a property of the semiconductor material. The recombination rate limits the response time of the photoconductor; the unrecombined carriers can cause a lingering current due to the excess carriers that remain for a time even after radiation is removed.

Addressing the problems of response time and sensitivity, scientists have developed photodetectors with response times down to the picosecond range, and other, different photodetectors with sensitivities up to the 0.5 amps/watt range. However, no photodetectors have both a response time in picoseconds and a sensitivity of 0.5 amps/watt; i.e., there appears to be a tradeoff between the response time and sensitivity when photoconductive semiconductor material is used as a photodetector. This tradeoff has the result that a photodetector designed for a short response time typically has a low sensitivity, and a photodetector designed for a high sensitivity typically has a longer response time.

It is believed that the reasons for the tradeoff between response time and sensitivity are found in the properties of the semiconductor material itself. The unbound electrons in any semiconductor material have a mean lifetime before they are recombined with a hole. The value of the mean lifetime depends upon the characteristics of the semiconductor material. The faster the rate of recombination, the shorter the response time. Furthermore, the unbound electrons have a mobility figure dependent upon the semiconductor material; higher mobility materials have a greater sensitivity. In summary, the resulting tradeoff between response time and sensitivity appear to be a direct result of competing properties of the semiconductor material: recombination rate vs. electron mobility.

Conventional photodetectors designed for high sensitivity at the expense of response time typically comprise an active layer having high mobility, such as Gallium Arsenide (GaAs). In its pure crystalline form, GaAs has a high electron mobility (high sensitivity) but low recombination rate (slow). When used in the active layer in a conventional photodetector, it produces a larger amount of current for a given amount of light.

In order to increase the response time at the expense of sensitivity, semiconductor materials have been selected and fabricated that have a short recombination time for free carriers (i.e., a fast recombination rate). One effective method of reducing the free-carrier lifetime is to introduce a moderate density of defects into the semiconductor which act as traps for the carriers and recombination centers. These defects include defects to the crystal structure. Traps can capture carriers as they drift around, and once trapped there is a finite probability for recombination with other drifting carriers. Thus, by introducing defects to the crystal structure, a material is created with a high recombination rate due to the increased number of recombination centers; however the increased number of recombination centers affects mobility adversely. Examples of processes for introducing defects includes radiation damage such as neutron irradiation, introduction of impurities, or the use of materials with large densities of naturally occurring defects such as polycrystalline and amorphous semiconductors. Another method for growing a highly defective layer is described in a publication by F. W. Smith, et al., *Picosecond GaAs-based Photoconductive Optoelectronic Detectors*, Appl. Phys. Lett., Vol. 54, No. 10, Mar. 6, 1989, pp. 890–892. In the Smith method, the defective layer is grown by molecular beam epitaxy (MBE) using Ga and $As_4$ beam fluxes at a substrate temperature of about 200° C. This substrate temperature is substantially lower than that usually used to deposit high quality conducting films of GaAs by MBE, which are usually 560° to 600° C. Thus a low temperature (LT) GaAs layer was grown at a rate of 1 $\mu$m/hour, under arsenic stable growth conditions.

When compared with GaAs, the LT GaAs layer grown by Smith had a very high resistance, which precluded measurement of mobility, indicating that the mobility is relatively low. In addition, a very short recombination time was measured, as well as a high dielectric constant, so that the LT GaAs should support high voltage pulses. The Smith publication discloses experiments when an LT GaAs layer is the active (top) layer in a photodetector. Two types of conventional switch configurations were tested, an Auston switch and a photoconductive gap switch. A temporal response of 1.6 picoseconds was measured at FWHM (Full Width Half Maximum). Furthermore the sensitivity of LT GaAs was better than that they had measured for switches based on damaged materials such as oxygen-implanted silicon on sapphire (SOS), or amorphous silicon, although sensitivity of LT GaAs was still much lower than the sensitivity of non-damaged material such as GaAs. A material such as LT GaAs having recombination centers may have a response time in the picosecond range; however the sensitivity is smaller because the additional recombination centers decrease the mobility of electrons by impeding their progress.

It is generally known that the sensitivity of a photoconductive block is inversely proportional to the distance between the electrodes; i.e., the closer the electrodes, the greater the sensitivity. This fact has led to the design of interdigitated photodetectors, now conventional, that comprise a number of electrodes separated by gaps that have been reported to be as small as 0.5 microns. A light beam to be detected is made incident upon the interdigitated structure, illuminating many gaps simultaneously and thereby providing a very sensitive output. A disadvantage of the interdigitated structure is that a substantial portion of the incident light is lost to reflection from the electrodes.

Another type of conventional photodetector is the photodiode, which comprises a layer of p-doped semiconductor (p-type) material and a layer of n-doped semiconductor (n-type) material. Light is made incident on the depletion region between the p-type and the n-type material, creating electron-hole pairs and thus a current. To control the thickness of the depletion region, a layer of intrinsic material may be inserted between the layer of p-doped semiconductor material and the layer of n-doped semiconductor material. Such a diode is termed a "p-i-n" diode for the configuration of semiconductor material in the diode. The intrinsic (i) material may be a very thin (typically 0.5 micron) layer of intrinsic material such as GaAs having a high mobility. This type of detector has a high sensitivity and a fast response time. The pin diode can detect radiation at infrared wavelengths such as 0.8 to 1.3 microns, and thus can used for detectors in fiber optic communications systems. The pin diode has a disadvantage; due to the small size of the intrinsic layer, the diode's response is capacitively limited if the detector area is too large. Another disadvantage is that the structure is not monolithic, which limits its applications in integrated circuits for example.

It is conventional that the intrinsic (i) layer of the pin diode be graded between the p and the n-doped region to assist in carrier separation. In operation of a pin photodiode, a reverse-bias voltage is applied across the photodiode and light is made incident upon the intrinsic region. The electron-hole pairs then separate under the applied electric field and quickly migrate toward their respective poles; the electrons move toward the positive pole and the holes move toward the negative pole. Due to the narrowness of the intrinsic region and also due to the high mobility of the intrinsic material, there is little chance that the carriers will recombine before they arrive at the interface with the doped material. The electrons and holes then collect near the respective interface with the doped material. As a result of charge collection, the response of the pin photodiode is capacitively limited.

To detect low levels of radiation, a photodiode may be operated in the avalanche mode of operation. If a large reverse-bias is placed across a photodiode, the free carriers are accelerated to such a high energy that many other electron-hole pairs are created by collision, thus producing a large current for a small amount of incident radiation. Although an avalanche photodiode has increased sensitivity, accurate measurement of the intensity of incident radiation is difficult or impossible, and the response time is only in the nanosecond range.

It would be an improvement to provide a photodetector that has a high sensitivity and also a fast response time. It would be a further improvement if the photodetector is not capacitively limited, if the area exposed to incident radiation may be large, if the photodetector could absorb a large amount of incident energy, or if the photodetector could detect a wide range of wavelengths, including the infrared and x-ray wavelengths.

SUMMARY OF THE INVENTION

The present invention provides a photodetector in a small compact package that offers an advantageous combination of sensitivity and speed; it has a high sensitivity while retaining high speed.

The present invention comprises a photodetector having an active layer, a recombination layer, and a pair of electrodes coupled to the active layer. The active layer has an exposed surface for coupling light to be detected, and comprises a semiconductor having a bandgap graded so that carriers that may be formed due to interaction of the active layer with the incident radiation tend to be swept away from the exposed surface. The electrodes are positioned to apply a voltage across this interaction region of the active layer. An electrical unit is connected to the electrodes, to apply the voltage across the interaction region and to measure current that may be generated by photoconduction. The recombination layer comprises a semiconductor material having a short recombination time, and is positioned adjacent to the active layer so that carriers from the active layer tend to be swept into the recombination layer. The recombination layer may be disposed in a substrate of semi-insulating semiconductor material.

The graded semiconductor material in the active layer may comprise $Al_{1-x}Ga_xAs$ with x (the fraction of Ga atoms with respect to Al) varying from a high x at the exposed region to zero at the interface with the recombination layer comprising a material with a short recombination time such as a defective GaAs layer grown in a low temperature (LT) process. Furthermore, the active layer may comprise an additional sublayer of graded $In_{1-y}Ga_yAs$ between the $Al_{1-x}Ga_xAs$ layer and the defective LT GaAs layer. The active layer may be grown by conventional epitaxial techniques, for example molecular beam epitaxy (MBE), liquid phase epitaxy (LPE), or metal organic chemical vapor deposition (MOCVD). The recombination layer or LT GaAs can be grown on a substrate such as SI GaAs or silicon.

In operation, a voltage is applied by the electrical unit across the electrodes, creating a potential difference across the gap between the electrodes. When electromagnetic radiation having a high enough photon energy interacts with the active layer, electron-hole pairs are formed. Under the applied electric field, the electron-hole pairs separate and thus create a current which is detectable at the electrodes. In addition to being affected by the electric field, the photogenerated charge carriers are swept downward away from the exposed surface toward the recombination layer due to the bandgap grading of the active layer. When the carriers arrive at the defective layer the electrons and holes recombine with a very short characteristic time constant such as 1 picosecond. The current observed at the electrodes decreases as the photogenerated charge carriers are removed from the bandgap graded active layer and subsequently recombined in the recombination layer, thus providing a fast response. It is believed that the speed of the photodetector is determined by the time it takes to remove the charge from this layer ($\approx 1$ picosecond/1000 Å), in combination with the recombination time of the defective layer.

This concept allows for larger geometry photodetectors since it is not necessary to collect the total charge in the desired time of response by the electrodes to achieve a fast response. In other words, the geometry of the area exposed to incident radiation may be larger than that of previous photodetectors. Such a larger geometry photodetector may have application in detecting radiation at shorter wavelengths, such as x-ray radiation.

In another preferred embodiment, the photodetector may comprise one or more additional layers stacked below the active and recombination layers. These additional layers may include another active layer and another recombination layer to absorb radiation not absorbed while passing through the first layers. A photodetector having a stacked configuration may have enhanced sensitivity and responsiveness at selected wavelengths such as infrared.

The photodetector of the present invention may have application in communications, the military, research, and GaAs integrated circuits. Many other applications exist; the present invention is not limited to the above applications.

DETAILED DESCRIPTION OF THE INVENTION

The invention is best understood by reference to the figures wherein like parts are designated with like numerals throughout.

Figure 1:
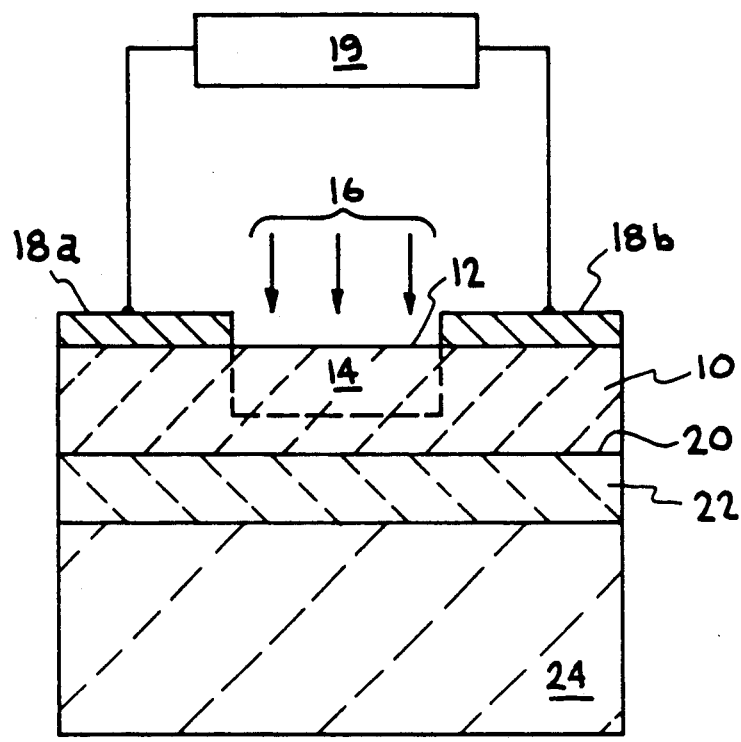
FIG. 1 illustrates a cross-section of a preferred embodiment of the photodetector of the present invention in a single active layer configuration.

Referring to FIG. 1, the present invention comprises an active layer 10 of semiconductor material having a bandgap graded from a surface 12 toward its interior. The graded bandgap semiconductor material of the layer 10 may be formed conventionally by varying its composition. The active layer 10 comprises an interaction region 14, bounded on one side by the surface 12 through which electromagnetic radiation 16 such as light can be coupled into the active layer 10. The source of electromagnetic radiation 16 may be a laser or a fiber optic cable, for example. For effective coupling, the electromagnetic radiation 16 may be made incident upon the surface 12 at a normal (perpendicular) angle of incidence. The interaction region 14 includes those portions of the active layer 10 that interact with the electromagnetic radiation 16. A pair of electrodes 18a,18b are connected on opposing sides of the surface 12.

A conventional electrical unit 19 is connected to the electrodes 18 for measuring the current through a photodetector, while applying a voltage, such as approximately 50 volts/micron across the gap. The electrical unit 19 may be a Tektronix 7104 oscilloscope with S-4 sampling heads, although other commercially available units may provide acceptable results. In operation of the photodetector, a voltage created by the unit 19 is applied between the electrodes 18a,18b. When no electromagnetic radiation 16 is present the resistance is high, and only a limited ("dark") current can be measured. However, when electromagnetic radiation 16 is applied to the interaction region 14, a current can be measured by the unit 19. The unit 19 may be operated in real time to measure the intensity of the electromagnetic radiation 16 and its variation over time. The wavelength of the electromagnetic radiation 16 may be any wavelength that can be detected by the material in the active layer, and is not limited to any specific wavelength.

The active layer 10 includes a bottom surface that is the interface 20 with a layer 22 comprising a semiconductor material with a fast recombination rate such as highly defective semiconductor material produced by the low temperature (LT) process such as LT GaAs. The layer 22, on its opposing side is connected to an insulating substrate 24 such as semi-insulating (SI) GaAs or SI silicon. Fabrication of the substrate 24 may be accomplished using any of a number of known methods, such as the Czochralski growth method.

The active layer 10 is graded in a manner so that the photogenerated charge carriers, once free, tend to be swept along the gradient in the active layer in a direction away from the surface of the interaction region 14, toward the recombination layer 22. The graded active layer 10 is illustrated in the energy level diagram of FIG. 2. As typical of semiconductors, the allowed energy levels include a partially filled valence band at lower energies and partially filled conduction band at higher energies. Between the conduction band and the valence band is a band of energies that are not allowed; this band is termed the forbidden band. The energy separating the conduction band from the valance band is the bandgap of the semiconductor material. A photon will be absorbed in intrinsic material to create an electron-hole pair if the bandgap energy is equal to or less than the photon energy.

Figure 2:
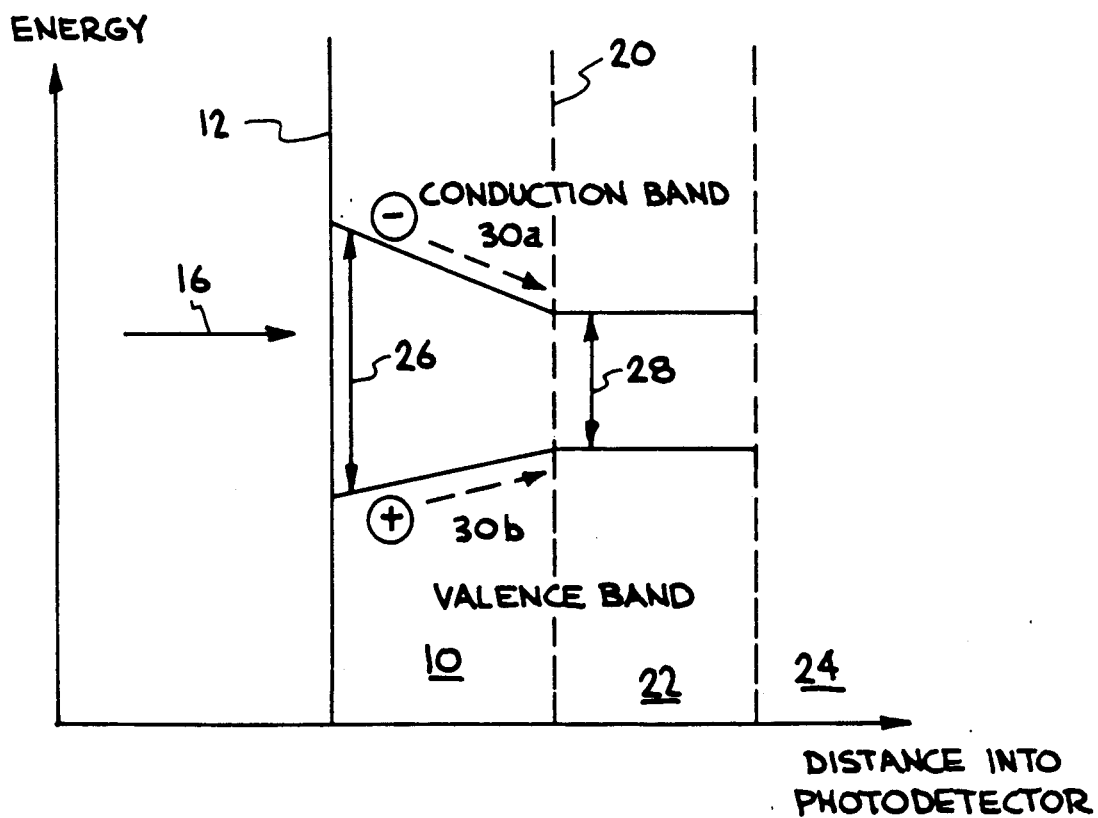
FIG. 2 is an energy level diagram of the preferred embodiment of the photodetector of the present invention, illustrating the energy levels of the conduction band and the valence band in the photodetector.

The active layer 10 comprises a large bandgap 26 at the surface 12, and then narrows along a gradient in both the conduction band and the valence band to a smaller bandgap 28 at the interface 20 with the recombination layer 22. The effect of the graded bandgap on the free carriers is illustrated in FIG. 2. Once an electron-hole pair is created, the carriers tend to travel from the wider bandgap to the narrower bandgap along the lines 30a, 30b illustrated in that figure; the electrons tend to travel along the line 30a, and the holes tend to travel along the line 30b.

Preferably, the active layer 10 comprises gallium arsenide (GaAs) doped with aluminum (Al) in a concentration that decreases uniformly from the top to the bottom. In other words, the active layer 10 preferably comprises $Al_{1-x}Ga_xAs$ with x (the fraction of Ga atoms with respect to Al) varying from a low value at the surface 12 to a high value at the interface 20. While there is no preferable x variation, good results have been produced with an x of 0.3 at the surface of the exposed interaction region 14, varying approximately uniformly to a value of 1.0 at the interface with the recombination layer 22. An x varying from 0.0 at the surface to 1.0 at the interface (i.e., AlAs to GaAs) has also been found adequate; however the higher Al concentration tends to degrade mobility, and therefore decreases sensitivity. The $Al_{1-x}Ga_xAs$ layer is preferably intrinsic, although it may be slightly n-type or p-type. The active layer 10 may be grown by conventional epitaxial techniques, for example molecular beam epitaxy (MBE), liquid phase epitaxy (LPE), or metal organic chemical vapor deposition (MOCVD). Preferably, the thickness of the active layer 10 is between 1000 Å and 5000 Å. A narrower thickness would produce a faster response, while a larger thickness would absorb more of the incident radiation thereby increasing sensitivity.

Figure 11:
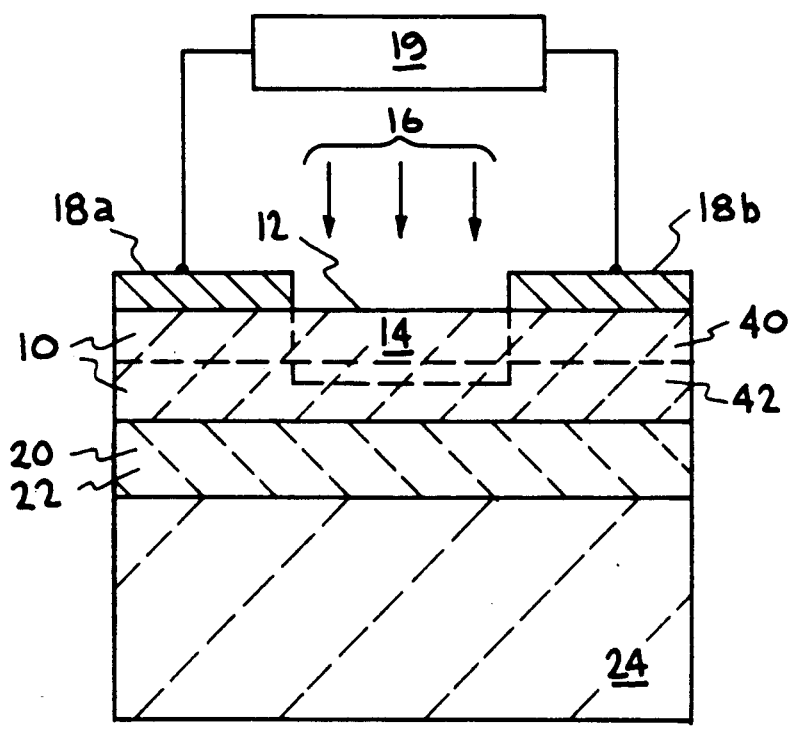
FIG. 11 is a cross-section of an embodiment of the present invention wherein the active layer comprises two sub-layers.

In another embodiment such as illustrated in FIG. 11, the active layer 10 may include a first sub-layer 40 of $Al_{1-x}Ga_xAs$ graded as above up to x=1, (i.e., to GaAs) and a second sub-layer 42 of $In_{1-y}Ga_yAs$, with y decreasing from 1 down to another value, for example 0.5. The addition of indium provides increased mobility that may provide increased sensitivity and a faster response time.

The electrodes 18a,18b comprise a material for conducting current that is attachable to the active layer 10. For example n+ material may be used to form the electrodes. As another example, an alloy implant may be used.

Figure 3:
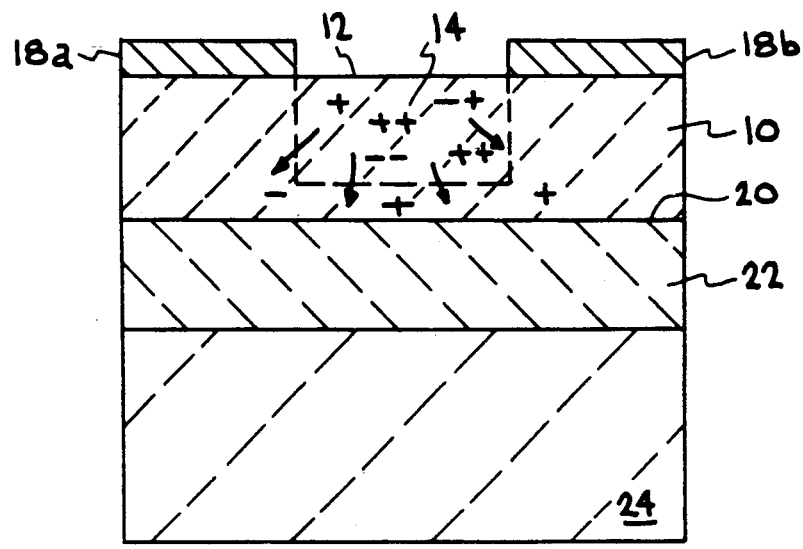
FIG. 3 is a cross-section of the photodetector, illustrating photogenerated charge carriers and their preferred direction of travel.

The process of photoconduction in the photodetector of the present invention may be described with respect to the energy level diagram of FIG. 2 and the cross-section of FIG. 3. In operation, a voltage is applied across the electrodes, creating a potential difference across the photoconductor. When electromagnetic radiation 16 is applied that has a photon energy equal to or greater than the bandgap energy, electron-hole pairs are formed in or below the interaction region 14. Under the applied electric field, the electron-hole pairs separate, creating a current which can be detected at the electrodes 18a,18b. The magnitude of the output current depends in part on the mobility or drift velocity of the photogenerated charge, hence a higher peak current is observed for the same amount of photogenerated charge in the active layer 10 than that of the underlying recombination layer 22 which has a low mobility or carrier drift velocity due to the large amount of defects.

In addition to the effect of the applied voltage upon the carriers, they tend to be swept away from the surface 12 toward the recombination layer 22 by the effect of the bandgap grading of the active layer 10, illustrated by the four arrows in FIG. 3. This effect has been previously described with respect to FIG. 2. Once the carriers arrive in the recombination layer 22, the carriers recombine quickly with a characteristic time constant dependent upon the material comprising the recombination layer 22. If the layer 22 comprises a LT GaAs layer described in a publication by F. W. Smith, et al., *Picosecond GaAs-based Photoconductive Optoelectronic Detectors*, Appl. Phys. Lett., Vol. 54, No. 10, Mar. 6, 1989, pp. 890–892, the characteristic time constant will be approximately 1 picosecond. The current observed at the electrodes will decrease as the photogenerated charge is removed from the graded active layer and subsequently recombined in the LT GaAs layer. It is believed that the speed of the photodetector is determined by the time it takes to remove the charge from this layer ($\approx 1$ picosecond/1000 Å), in combination with the recombination time of the LT GaAs.

This concept allows for larger geometry photodetectors because it is believed unnecessary to collect the total charge in the desired time of response by the electrodes to achieve a fast response, i.e., the photodetector is not capacitively limited. By large geometry, it is meant that the width of the area exposed to incident radiation may be made as large as 5 mm or more. Such a larger geometry photodetector may have application in detecting radiation at shorter wavelengths, such as x-ray radiation as well as application in detection of a radiation beam over a large area.

However, a smaller geometry photodetector may provide a more sensitive photodetector. For example, the present invention may be used as the base over which a conventional interdigitated structure may be formed.

Figure 4:
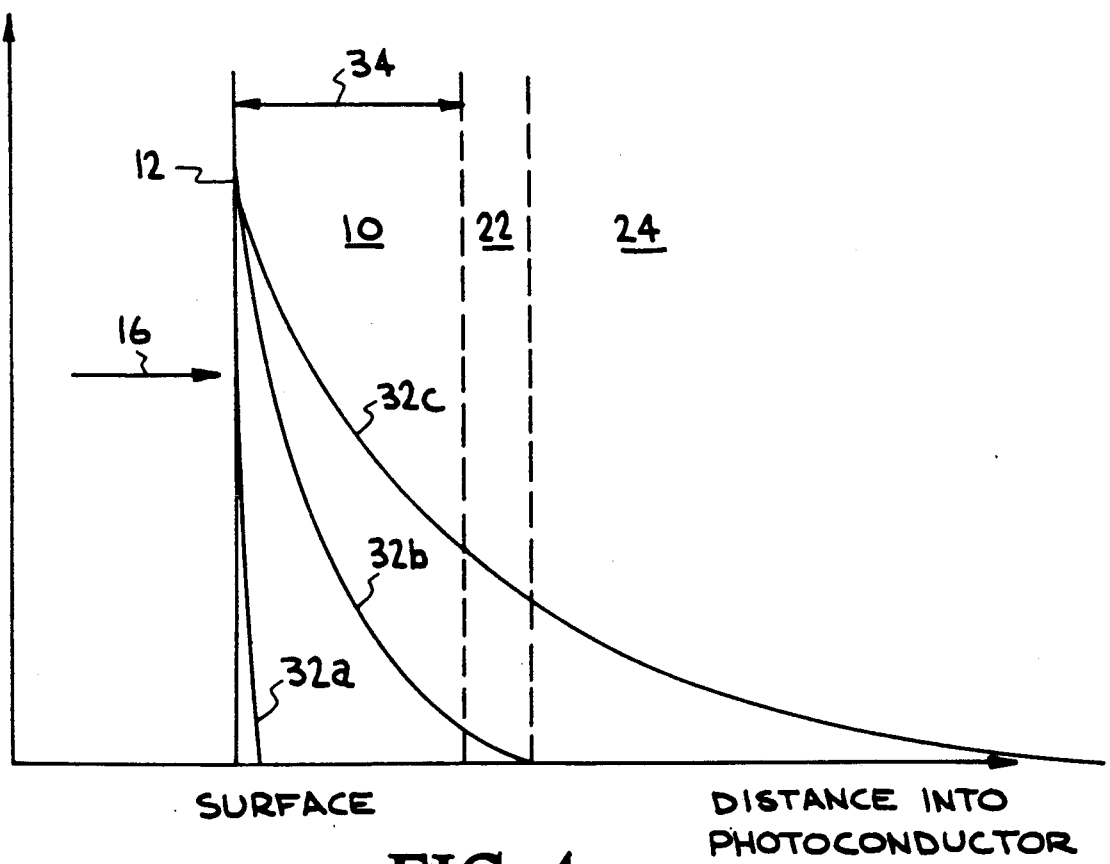
FIG. 4 is a graphical depiction of the amount of incident electromagnetic energy absorbed in the semiconductor material of the photodetector as a function of distance into the semiconductor.

When electromagnetic radiation 16 passes through any semiconductor material, it will be partially absorbed and partially transmitted. The amount absorbed is highly dependent upon the wavelength of the electromagnetic radiation 16 and the type of semiconductor material. FIG. 4 is a graphical illustration of the relationship between the energy absorption and distance into a semiconductor, comparing three different wavelengths. Line 32a illustrates the absorption of very short wavelength radiation such as x-rays, which is completely absorbed very close to the surface. A second line 32b illustrates the absorption of radiation with a wavelength that is substantially absorbed in the active layer 10. A third line 32c illustrates the absorption of a longer wavelength, such as an infrared wavelength. Radiation absorbed in the active layer 10 is substantially transformed to electron-hole pairs and translated into detectable current, while radiation absorbed in the recombination layer 22 is transformed into electron-hole pairs that are quickly recombined, producing a very small current. Thus a thickness 34 of the active layer 10 should be selected to absorb a substantial amount of radiation 16. If the thickness 34 is too narrow, sensitivity is decreased because fewer electron-hole pairs can be detected as current. If the thickness 34 is too wide, sensitivity may increase but the responsive time is also increased because the carriers must travel a longer distance to recombine. An optimum thickness 34 balances the sensitivity and response time at that wavelength. It will be apparent to one skilled in the art that the interior boundary of the interaction region 14 illustrated in FIG. 1 is not precisely defined by a sharp line, but by a gradual decay of the amount of absorption as illustrated in FIG. 4.

It has been found that single active layer 10 comprising $Al_{1-x}Ga_xAs$ and having the thickness 34 of 4000 Å will effectively absorb a substantial portion of electromagnetic radiation 16 with a wavelength of 800–900 nm. At longer infrared wavelengths, such as the 1300 nm wavelength that is of interest in fiber optic communications, the single layer of $Al_{1-x}Ga_xAs$ would have to be made wider. This thickness 34 would be such that the response time would increase dramatically. To absorb such infrared radiation, different materials may be used. Alternatively, a "stacked" configuration, illustrated in FIG. 5 has been developed wherein two or more active layer 10 are stacked together, separated by a layer of defective semiconductor 22.

Figure 5:
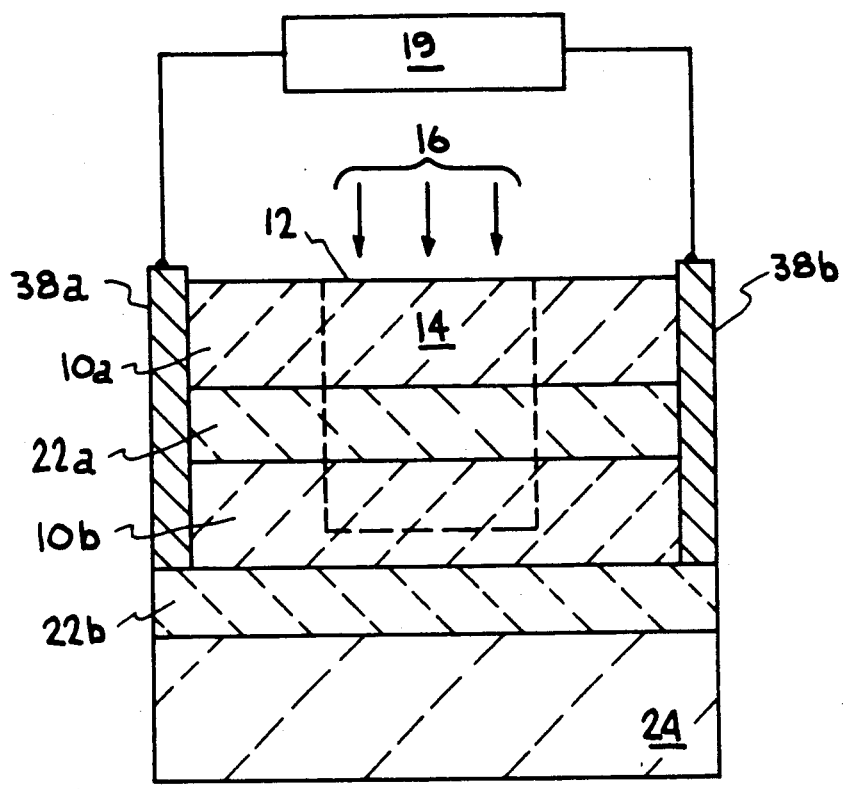
FIG. 5 is a cross-section of a preferred embodiment of the photodetector in a stacked configuration including two active layers.
Figure 8:
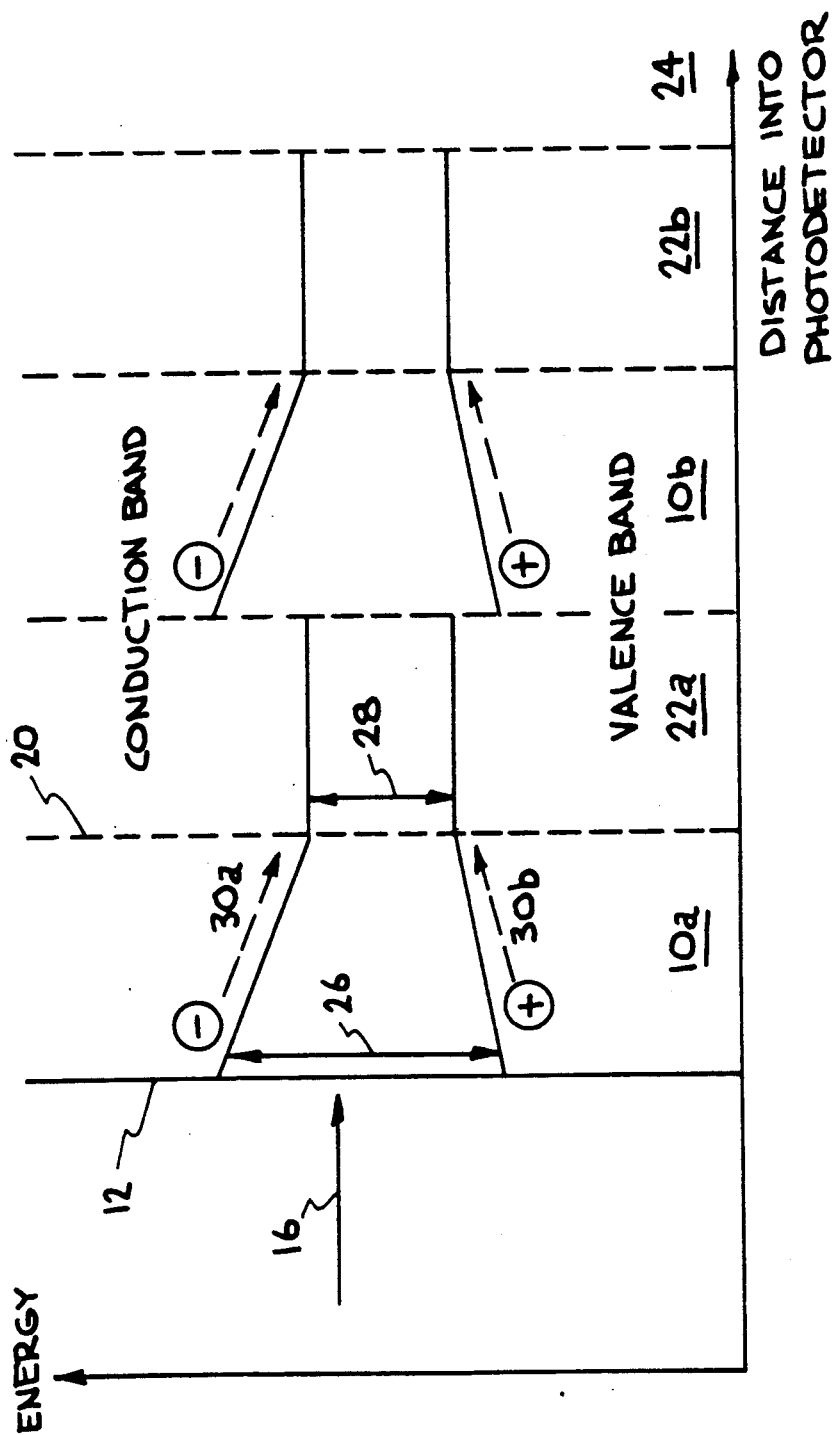
FIG. 8 is an energy level diagram of a preferred embodiment of the photodetector in the stacked configuration, illustrating the energy levels of the conduction band and the valence band in the photodetector.
Figure 9:
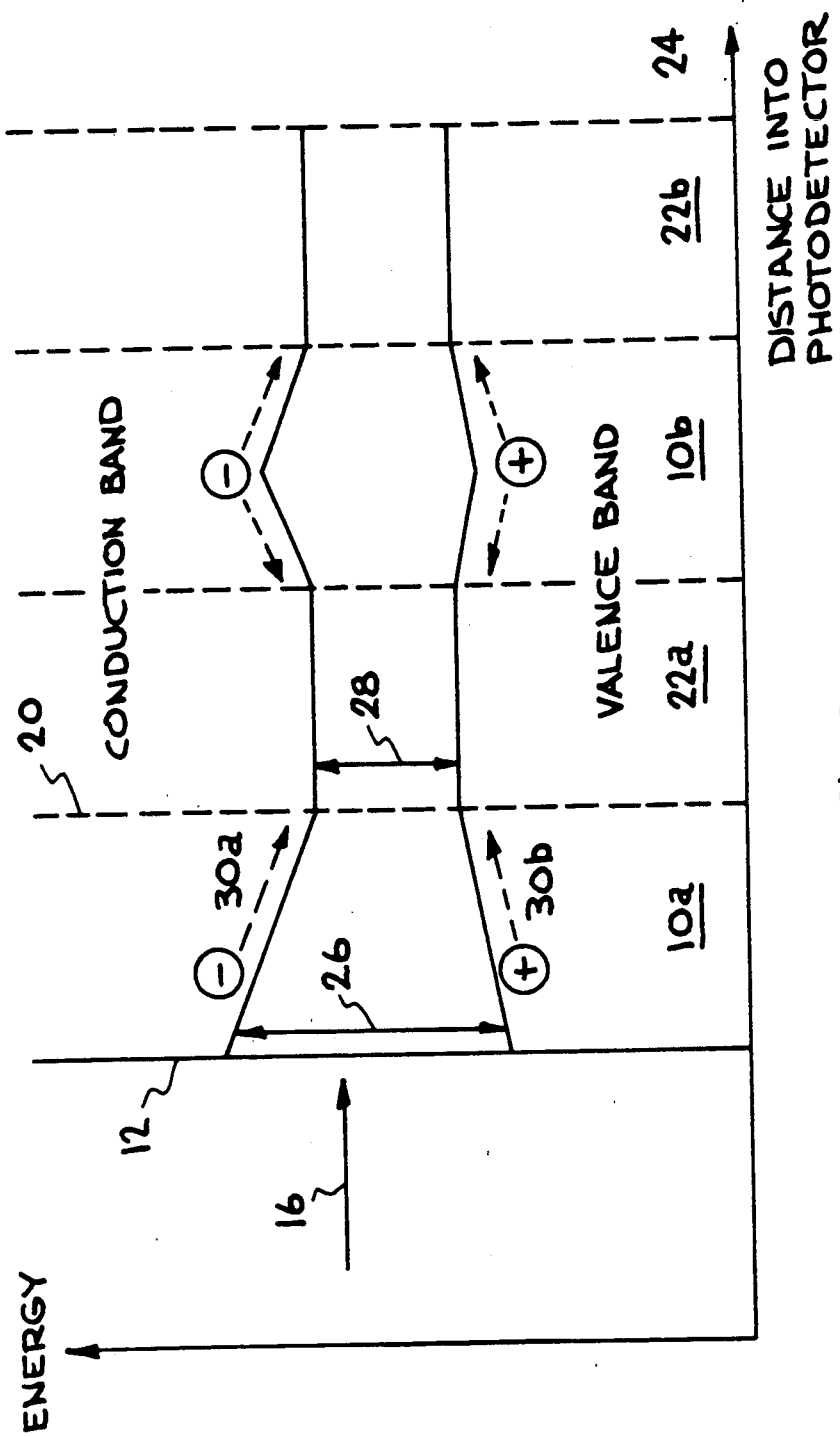
FIG. 9 is an energy level diagram of another preferred embodiment of the photodetector in a stacked configuration, illustrating the energy levels of the conduction band and the valence band in the photodetector.

In FIG. 5, the electrodes 38a, 38b extend to connect both active layers 10a, 10b with the electronic unit 19, to detect the current produced by photoconduction in each layer 10a, 10b. The first active layer 10a is graded so that the photogenerated carriers are swept toward the first recombination layer 22a, and the second active layer 10b is graded so that the photogenerated carriers are swept toward the second recombination layer 22b. This grading is shown graphically in FIG. 8. As an alternative grading illustrated in FIG. 9, the second active layer 10b may be graded so that the carriers generated proximate to the first recombination layer 22a are swept toward that layer 22a, and the carriers generated proximate to the second recombination layer 22b are swept toward that layer 22b. This grading in the second active layer 10b may be accomplished, for example, by varying the "x" in $Al_{1-x}Ga_xAs$ from 1.0 at the interface with the first recombination layer 22a to value such as 0.5 at a midpoint between the first layer 22a and the second layer 22b, and back to 1.0 at the interface with the second recombination layer 22b.

Figure 7:
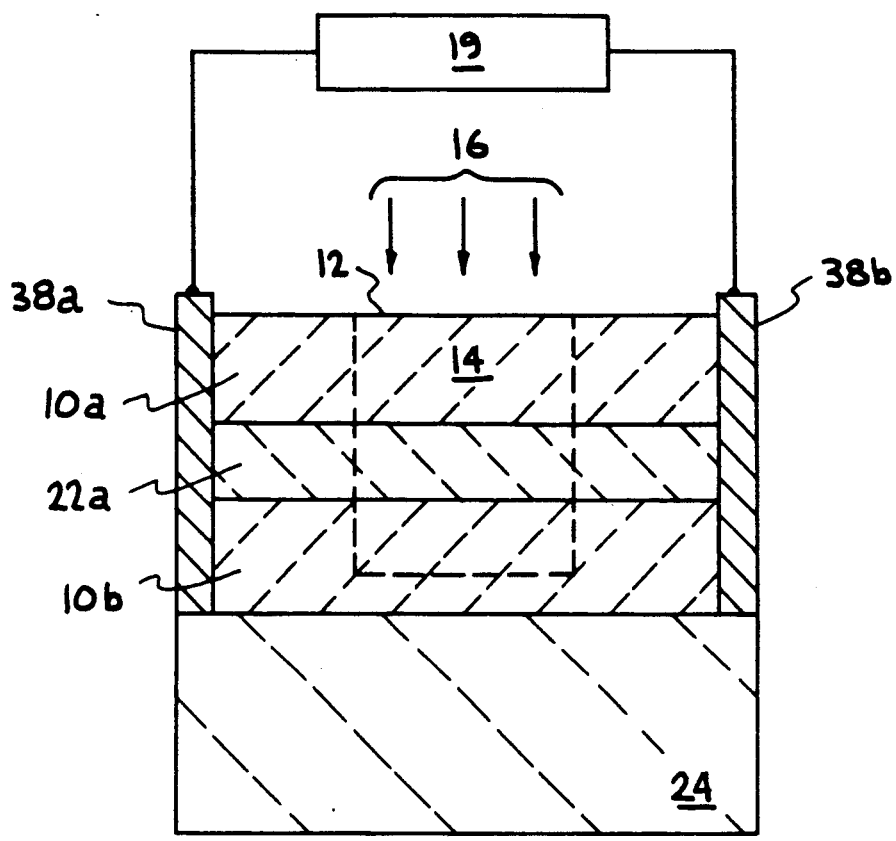
FIG. 7 is a cross-section of another preferred embodiment of the photodetector in a stacked configuration.
Figure 10:
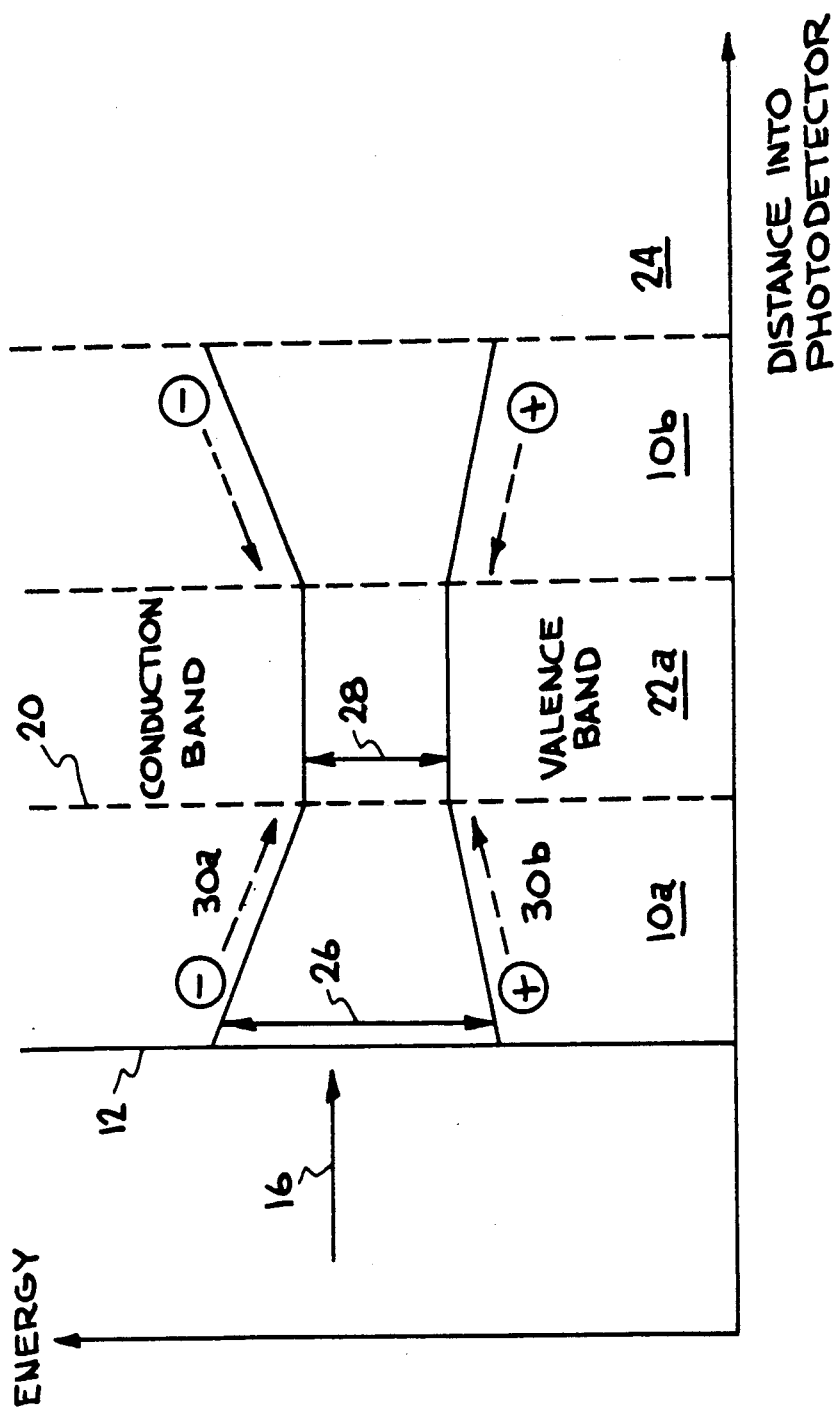
FIG. 10 is an energy level diagram of still another preferred embodiment of the photodetector in a stacked configuration, illustrating the energy levels of the conduction band and the valence band in the photodetector.

As another alternative, illustrated in FIG. 7, a second recombination layer is unnecessary. This is practical if the second active layer 10b is graded as shown graphically in FIG. 10 so that the photogenerated carriers are swept back toward the first recombination layer 22a. This grading in the second active layer 10b may be accomplished, for example, by varying the "x" in $Al_{1-x}Ga_xAs$ from 1.0 at the interface with the first recombination layer 22a to a value such as 0.2 at the interface with the substrate 24.

Figure 6:
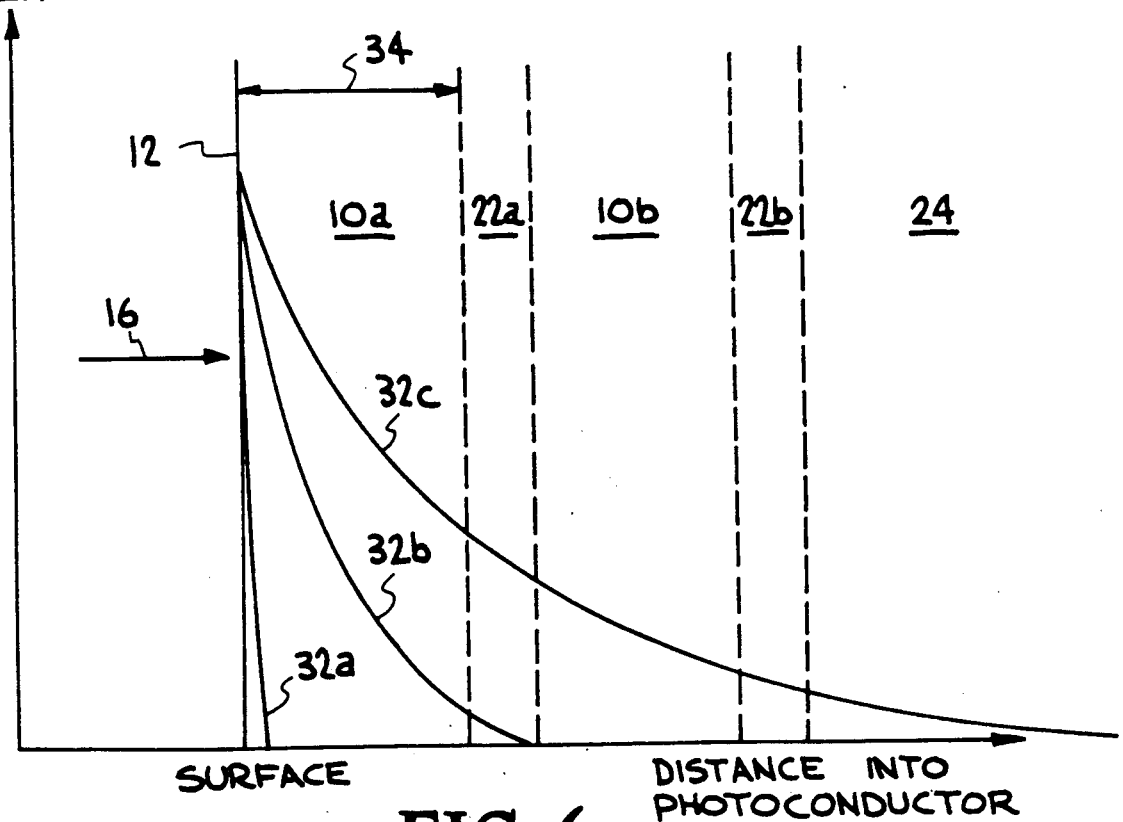
FIG. 6 is a graphical depiction of the amount of incident radiation absorbed in the stacked photodetector as a function of distance.

The line 32c in FIG. 6 illustrates the absorption in a stacked structure. A portion of the incident radiation 16 is absorbed in the first active layer 10a; a smaller portion is absorbed in the first recombination layer 22a, and another portion is absorbed in the second active layer 10b. As a result, a substantial portion of the incident radiation 16 is absorbed in the active layers 10a, 10b. Thus, the stacking architecture provides a photodetector for infrared radiation having a faster response and greater sensitivity.

In other embodiments, two, three, or more active layers 10 may be stacked so that photogenerated carriers are swept to a nearby recombination layer 22. The number of active layers 10 and their respective thickness may be chosen in order to achieve a desirable sensitivity and response time at a particular wavelength.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing descriptions. All changes which come within the meaning and range of equivalency of the claims are to be embraced within their scope.

We claim:

1. A photodetector for detecting electromagnetic radiation, said photodetector comprising:
   an active layer having a surface for coupling electromagnetic radiation into the active layer, said active layer comprising a semiconductor having a graded bandgap;
   a pair of electrodes electrically connected to said active layer, said electrodes being positioned to apply a voltage across the active layer;
   a recombination layer comprising a semiconductor material having defects for recombining carriers including electrons and holes, said recombination layer being positioned adjacent to the active layer so that the carriers formed in the active layer can flow across an interface between the active layer and the recombination layer;
   said active layer having a bandgap graded so that carriers from the active layer tend to be swept into the recombination layer.

2. The photodetector as claimed in claim 1, further comprising a substrate connected to the recombination layer.

3. The photodetector as claimed in claim 2, wherein the substrate comprises a semi-insulating semiconductor.

4. The photodetector as claimed in claim 1, wherein the recombination layer comprises a semiconductor material having a defective crystal structure.

5. The photodetector as claimed in claim 4, wherein the recombination layer comprises GaAs.

6. The photodetector as claimed in claim 5, wherein the recombination layer comprises LT GaAs.

7. The photodetector as claimed in claim 1, wherein the active layer is graded such that its bandgap varies approximately uniformly from the coupling surface of the active layer to the interface with the recombination layer.

8. The photodetector as claimed in claim 1, wherein the active layer comprises a semiconductor having a high mobility.

9. The photodetector as claimed in claim 8, wherein the active layer comprises $Al_{1-x}Ga_xAs$, with x varying from a finite value at the coupling surface to zero at the interface with the recombination layer.

10. The photodetector as claimed in claim 9, wherein the value of x varies from 0.7 at the coupling surface to 0.0 at the interface with the recombination layer.

11. The photodetector as claimed in claim 8, wherein the active layer comprises a sub-layer of $Al_{1-x}Ga_xAs$, with x varying from a finite value at the coupling surface to zero at an interface with a second sub-layer comprising $In_{1-y}Ga_yAs$, with y varying from zero at the interface to a finite value at the interface with the recombination layer.

12. The photodetector as claimed in claim 11, wherein the value of y varies from 0.0 at the interface with the $Al_{1-x}Ga_xAs$ sub-layer, to a value of approximately 0.5 at the interface with the recombination layer.

13. A photodetector having a stacked configuration for detecting incident electromagnetic radiation of a selected wavelength, said photodetector comprising:
   a first active layer;
   a first recombination layer;
   a second active layer;
   said layers being aligned with respect to the incident electromagnetic radiation so that the electromagnetic radiation is directed to the first active layer, then the first recombination layer, and then the second active layer;
   said first active layer comprising a semiconductor material and having a surface through which incident electromagnetic radiation is coupled into said first active layer, said semiconductor having a bandgap graded so that carriers tend to be swept toward the recombination layer;
   said first recombination layer comprising a semiconductor material having defects for recombining carriers including electrons and holes, said first recombination layer being connected to the first active layer so that the carriers formed in the first active layer can flow across an interface between the first active layer and the first recombination layer, said first recombination layer having a thickness that allows passage of a substantial portion of the electromagnetic radiation;
   said second active layer comprising a semiconductor material, said second active layer being positioned to absorb electromagnetic radiation passing through the first active layer and the first recombination layer, said second active layer comprising a semiconductor having a graded bandgap;
   a pair of electrodes electrically connected to said first active layer and also connected to said second active layer, said electrodes being positioned to apply a voltage across the regions of the first and the second active layers interacting with electromagnetic radiation.

14. The stacked photodetector as claimed in claim 13, wherein the second active layer is graded so that the carriers tend to be swept toward the first recombination layer.

15. The stacked photodetector as claimed in claim 13, further comprising a second recombination layer connected to the second active layer, said second active layer being graded so that the carriers tend to be swept toward the second recombination layer, said second recombination layer having traps for recombining carriers including electrons and holes.

16. The stacked photodetector as claimed in claim 13, further comprising a second recombination layer, said second recombination layer being suitable for recombining carriers including electrons and holes, said second recombination layer being connected to the second active layer, said second active layer being graded so that the carriers proximate to the second recombination layer tend to be swept toward said second recombination layer, and the carriers proximate to the first recombination layer tend to be swept toward said first recombination layer.

17. The stacked photodetector as claimed in claim 13, wherein the first recombination layer comprises a semiconductor material having a defective crystal structure.

18. The stacked photodetector as claimed in claim 17, wherein the first recombination layer comprises LT GaAs.

19. The photodetector as claimed in claim 13, wherein the first active layer and the second active layer comprise a semiconductor having a high mobility.

20. The photodetector as claimed in claim 19, wherein the first active layer and the second active layer comprise $Al_{1-x}Ga_xAs$.

* * * * *